(12) United States Patent
Riggio et al.

(10) Patent No.: US 10,622,895 B2
(45) Date of Patent: Apr. 14, 2020

(54) SOLID-STATE POWER CONTROL METHOD AND APPARATUS

(71) Applicant: PowerBloks, LLC, Greeley, CO (US)

(72) Inventors: Christopher A Riggio, Greeley, CO (US); Ammon N Balaster, Boulder, CO (US)

(73) Assignee: POWERBLOKS, LLC

( * ) Notice: Subject to any disclaimer, the term of this patent is extended or adjusted under 35 U.S.C. 154(b) by 0 days.

(21) Appl. No.: 16/658,662

(22) Filed: Oct. 21, 2019

(65) Prior Publication Data
US 2020/0052590 A1 Feb. 13, 2020

Related U.S. Application Data

(63) Continuation-in-part of application No. 15/929,082, filed on Jan. 3, 2019, now Pat. No. 10,454,464.

(60) Provisional application No. 62/613,349, filed on Jan. 3, 2018.

(51) Int. Cl.
*H02M 3/158* (2006.01)
*H02M 7/538* (2007.01)
*G05F 1/56* (2006.01)
*H04L 12/10* (2006.01)

(52) U.S. Cl.
CPC .............. *H02M 3/158* (2013.01); *G05F 1/56* (2013.01); *H02M 7/53806* (2013.01); *H04L 12/10* (2013.01)

(58) Field of Classification Search
None
See application file for complete search history.

(56) References Cited

U.S. PATENT DOCUMENTS

| | | | |
|---|---|---|---|
| 2006/0007719 A1* | 1/2006 | Shannon | H05B 41/2827 363/132 |
| 2016/0091909 A1* | 3/2016 | Olejarz | G05F 1/56 323/280 |
| 2017/0308108 A1* | 10/2017 | Pigott | G05F 1/575 |
| 2019/0335552 A1* | 10/2019 | Iqbal | H05B 33/0845 |

* cited by examiner

*Primary Examiner* — Lincoln D Donovan
*Assistant Examiner* — Khareem E Almo
(74) *Attorney, Agent, or Firm* — Oppedahl Patent Law Firm LLC; Aileen Law (57) ABSTRACT

With the disclosed device, a control method is set forth to control the flow of power between an electrical source and an electrical load.

18 Claims, 6 Drawing Sheets

SOLID-STATE POWER CONTROL METHOD AND APPARATUS

FIELD OF ART

The disclosed device relates generally to electronic power control, and more specifically to a fluid, dynamic, multi-spectral modulation means and method to enable fixed or variable control between a source and a load.

BACKGROUND

It is well-known that an electromechanical relay (EMR) uses a physical moving part to connect contacts within the output component of the relay. The movement of this contact is generated using electromagnetic forces from the low-power input signal, allowing the completion of the circuit that contains the high-power signal. EMR typically use solenoids, coils, magnetic fields, springs and mechanical contacts to operate and switch a supply.

A solid-state relay (SSR) uses a low power electrical signal to generate an optical semiconductor signal, typically with an opto-coupler, that transmits and energizes the output signal. When activated, the input optical signal acts as the drive path to power a "switch" that allows a high voltage and or current signal to pass through the SSR's output component. Unlike EMR, the SSR lacks moving parts, hence the device is solid-state.

To date, there are no non-electromechanical product offerings available in the searchable market literature which address the need for an adjustable, high-current, solid-state solution (e.g., relay, contactor). Current options are limited and even those that may be available are non-adjustable (non-variable control). Further, solid state relays with very high current ratings (e.g., greater than 150 A) are still very expensive to buy due to their power semiconductor and heat sinking requirements, and as such, cheaper electromechanical contactors are frequently still used.

Conventional power control methods such as pulse-width modulation (PWM), pulse-frequency modulation (PFM), or various combinations of such modulation, are typically implemented with a dedicated power control integrated circuit (IC) which can involve size, cost, and circuit complexities and the associated consequences.

Not only can the disclosed device provide for the elimination of a dedicated modulation IC and associated circuitry, it provides improvements in size, cost, performance, complexity and can be used for a vast host of applications.

SUMMARY OF THE DISCLOSURE

The disclosed device provides for a simplified fixed control (mode 1) or variable control (mode 2) of power between an electrical source and an electrical load.

The disclosed device provides for the integration of a single conductor for user command and circuit power.

The disclosed device provides for the elimination of a dedicated modulation IC and associated circuitry as is found in the existing art.

The disclosed device provides for adaptive dither modulation (ADM) behavior that can be produced by making small voltage-level changes based on any desired control criteria.

The disclosed device provides for an avoidance of a mid-state, slow rise and fall time, drive input to any semiconductor chosen for power control.

The disclosed device provides for stable operation regardless of noise in the user command and power line.

The disclosed device provides for an adjustable current, non-mechanical solid-state contactor useful where a user-adjustable current path is required.

These and other aspects of the disclosed device and methodology will appear from the description and/or appended claims, reference being made to the accompanying drawings that form a part of this specification wherein like reference characters designate corresponding parts in the several views.

Before explaining the disclosed embodiments of the disclosed device, it is to be understood that the device is not limited in its application to the details of the particular arrangements shown, since the device is capable of other embodiments. Also, the terminology used herein is for the purpose of description and not of limitation.

DESCRIPTION OF THE DISCLOSED EMBODIMENTS

Figure 1:
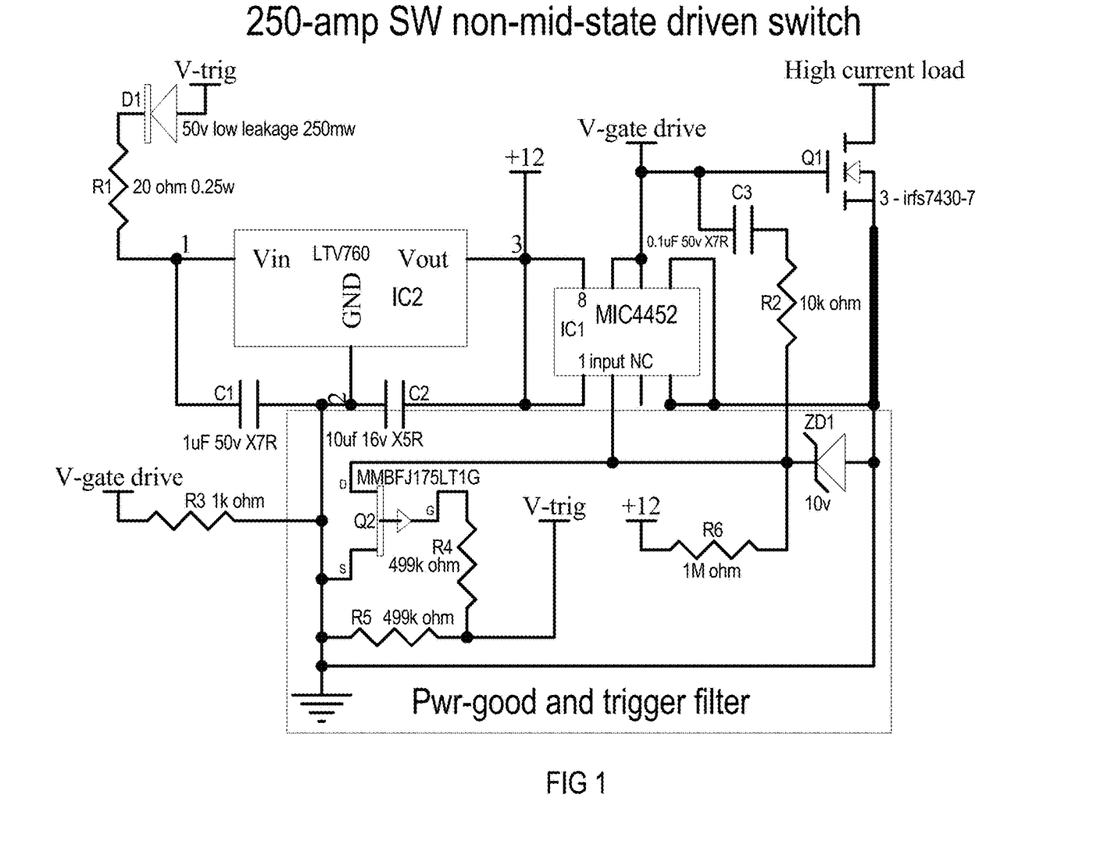
FIG. 1 is an electrical diagram illustrating a 250-amp, single-wire, non-mid-state driven, solid-state contactor (fixed control or mode 1).

The disclosed circuit shown in FIG. 1 operates in mode 1 (fixed control) and provides a noise-immune, non-mid-state, single-conductor, user-selectable drive to Q1 when V-trig is high. As is further described below, V-trig is designed to provide two functions—to provide circuit power as well as a command voltage. Drive IC1 issues a fast rise-time, high step-current, source-or-sink output state to Q1 gate upon the high, e.g., 15 to 30 vdc, or low, e.g., 0 vdc, application of the small, user-controlled, current input at V-trig. The V-trig line supplies circuit power through diode D1 and R1 to the C1-coupled input pin of voltage regulator IC2, inducing the C2-coupled output of regulator IC2. The output of regulator IC2 powers the IC1 drive and associated circuitry. V-trig also provides the command voltage to control the output state of drive IC1. When V-trig is low, the regulator IC2 input and transistor Q2 gate input is low. Ground-connected R3 holds drive IC1 output low until drive IC1 is powered. Zero voltage on the gate-pin of transistor Q2 clamps drive IC1 pin-2 low. When drive IC1 is powered, output low is internally clamped while pin-2 of drive IC1 is low.

When V-trig is high, voltage appears at the gate-pin of transistor Q2 from the divided output at R4 and R5 which turns off the drain-source path of transistor Q2, releasing the input clamp on pin-2 of drive IC1. The plus 12 vdc output of regulator IC2 connected through R6, ramps pin-2 of drive IC1 up to the output-high threshold voltage of drive IC1. The charging time of C3 through R2 and R6 determines the positive-voltage slope at pin-2 of drive IC1 and hence the Ton delay of drive IC1. When the IC1 drive output for Q1 goes high, a fast-rise, positive current is injected through R2 and C3 into the junction of Zener diode ZD1 and pin-2 of drive IC1. When V-trig is low, the Toff of drive IC1 is more immediate than the positive voltage slope since the gate-pin of transistor Q2 follows V-trig when low which clamps pin-2 of drive IC1 to ground, inducing the active-low clamping of the IC1 drive output prior to the depletion of C2. The action of each output transition at drive IC1 resets C3 to cause rapid injections of Ton or Toff current that latch a high or low input state for pin-2 of drive IC1 to prevent any mid-state instability issues in IC1 and damage to power semi-conductor Q1. Thus, the disclosed device provides stability which enables a non-mid-state environment to exist as well as noise filtering and eliminating the need for a dedicated modulation IC and associated circuitry.

Figure 1A:
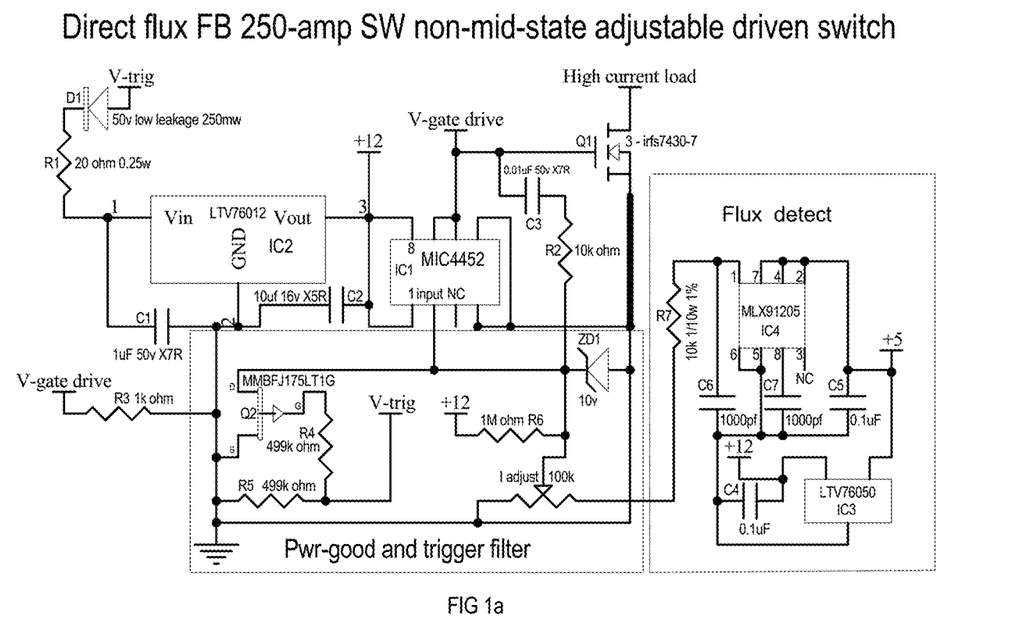
FIG. 1a is an electrical diagram illustrating a 250-amp, single-wire, non-mid-state driven, direct flux-controlled feedback, current-adjustable, solid-state contactor operating in ADM mode (mode 2).

The disclosed circuit shown in FIG. 1a operates in two modes from basic component-value programming: mode 1, as a single-wire, non-mid-state, on-off controller, and mode 2, as a non-mid-state controller as well as a feedback-directed ADM controller. The default operating mode is mode 1 until a feedback condition induces mode 2. In each mode, the V-trig line supplies circuit power through diode D1 and R1 to the C1-coupled input pin of voltage regulator IC2, inducing the C2-coupled output of regulator IC2. The output of regulator IC2 powers the IC1 drive, the C4-coupled input of voltage regulator IC3, and associated circuitry. The C5-coupled output of regulator amplifier IC3 powers the supply input of flux amplifier IC4. V-trig also provides the command voltage to control the output state of drive IC1 for modes 1 and 2. When V-trig is low, the regulator IC2 input and transistor Q2 gate input is low. Ground-connected R3 holds drive IC1 output low until drive IC1 is powered. Zero voltage on the gate-pin of transistor Q2 clamps drive IC1 pin-2 low. When drive IC1 is powered, output low is internally clamped while pin-2 of drive IC1 is low.

When V-trig is high, voltage appears at the gate-pin of transistor Q2 from the divided output at R4 and R5 which turns off the drain-source path of transistor Q2, releasing the input clamp on pin-2 of drive IC1. The plus 12 vdc output of regulator IC2 connected through R6, ramps pin-2 of drive IC1 up to the output-high threshold voltage of drive IC1. The charging time of C3 through R2 and R6 determines the positive-voltage slope at pin-2 of drive IC1 and hence the Ton delay of drive IC1. When the IC1 drive output for Q1 goes high, a fast-rise, positive current is injected through R2 and C3 into the junction of Zener diode ZD1 and pin-2 of drive IC1. When V-trig is low, the Toff of drive IC1 is more immediate than the positive voltage slope since the gate-pin of transistor Q2 follows V-trig when low which clamps pin-2 of drive IC1 to ground, inducing the active-low clamping of the IC1 drive output prior to the depletion of C2. The action of each output transition at drive IC1 resets C3 to cause rapid injections of Ton or Toff current that latch a high or low input state for pin-2 of drive IC1 to prevent any mid-state instability issues in drive IC1 and damage to power semi-conductor Q1.

The operating mode is selected by changing the value of C3 for slower (mode 1) or faster (mode 2) response. For mode-2 (ADM operation), a 0 to 5 vdc level from C6-coupled pin-1 of flux amplifier IC4 is summed into the junction at pin-2 of drive IC1 where R7 and R-I-adjust (e.g., a potentiometer), induce ADM-regulation behavior to maintain a user-selectable load current. The disclosed device results in ADM behavior that can be produced by making small voltage-level changes based on the desired control criteria.

Figure 1B:
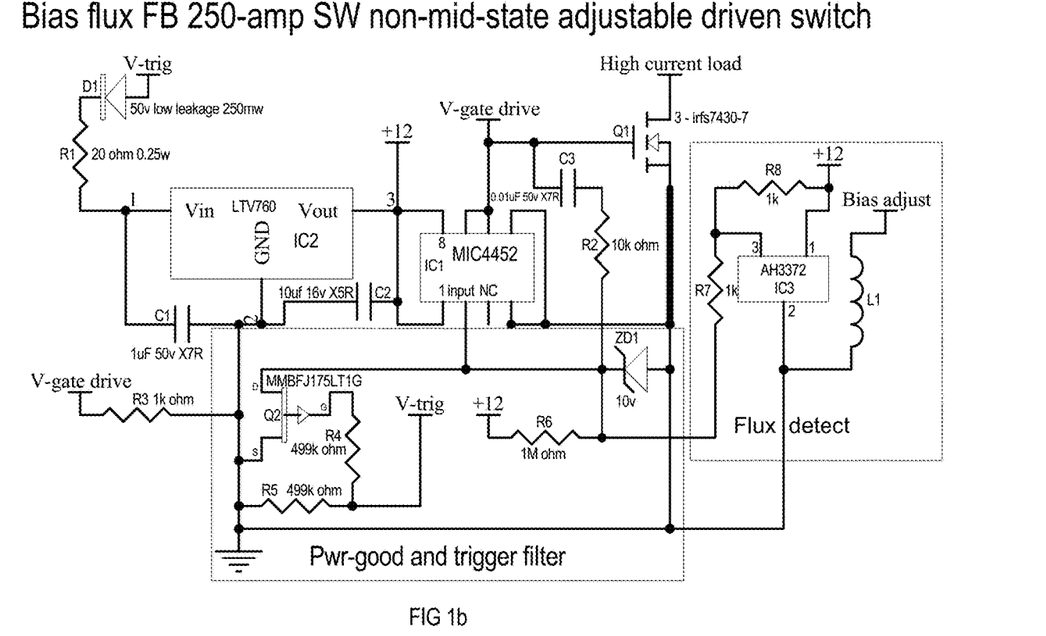
FIG. 1b is an electrical diagram illustrating a 250-amp, single-wire, non-mid-state driven, bias flux-controlled-feedback, current-adjustable, solid-state contactor operating in ADM mode (mode 2).

The disclosed circuit shown in FIG. 1b operates in two modes from basic component-value programming: mode 1, as a single-wire, non-mid-state, on-off controller, and mode 2, as a non-mid-state controller as well as a feedback-directed ADM controller. The default operating mode is mode 1 until a feedback condition induces mode 2. In each mode, the V-trig line supplies circuit power through diode D1 and R1 to the C1-coupled input pin of voltage regulator IC2, inducing the C2-coupled output of regulator IC2. The output of regulator IC2 powers the IC1 drive, the R8-coupled pull-up of flux amplifier IC3, and associated circuitry. V-trig also provides the command voltage to control the output state of drive IC1 for modes 1 and 2. When V-trig is low, the regulator IC2 input and transistor Q2 gate input is low. Ground-connected R3 holds drive IC1 output low until drive IC1 is powered. Zero voltage on the gate-pin of transistor Q2 clamps drive IC1 pin-2 low. When drive IC1 is powered, output low is internally clamped while pin-2 of drive IC1 is low.

When V-trig is high, voltage appears at the gate-pin of transistor Q2 from the divided output at R4 and R5 which turns off the drain-source path of transistor Q2, releasing the input clamp on pin-2 of drive IC1. The plus 12 vdc output of regulator IC2 connected through R6, ramps pin-2 of drive IC1 up to the output-high threshold voltage of drive IC1. The charging time of C3 through R2 and R6 determines the positive-voltage slope at pin-2 of IC1 and hence the Ton delay of drive IC1. When the IC1 drive output for Q1 goes high, a fast-rise, positive current is injected through R2 and C3 into the junction of Zener diode ZD1 and pin-2 of drive IC1. When V-trig is low, the Toff of drive IC1 is more immediate than the positive voltage slope since the gate-pin of transistor Q2 follows V-trig when low which clamps pin-2 of drive IC1 to ground, inducing the active-low clamping of the IC1 drive output prior to the depletion of C2. The action of each output transition at drive IC1 resets C3 to cause rapid injections of Ton or Toff current that latch a high or low input state for pin-2 of drive IC1 to prevent any mid-state instability issues in drive IC1 and damage to power semi-conductor Q1.

The operating mode is selected by changing the value of C3 for slower (mode 1) or faster (mode 2) response. For mode-2 ADM operation, a 0 to 5 vdc level from IC3 is summed through R7 into the junction at pin-2 of drive IC1. Flux amplifier IC3 receives power through R8 from the output of regulator IC2. Flux amplifier IC3 is a high-sensitivity, fixed-output flux amplifier whose output is held high by R8, and remains so until pin-3 of flux amplifier IC3 goes low in response to the flux induced by the Q1 load current. The flux amplifier IC3 pin-3 output high or low threshold flux is altered by a user-controlled inductor (e.g., an electromagnet) L1-bias current. Inductor L1 produces a counter flux resulting in flux-proportional voltage level changes at pin-3 of flux amplifier IC3 through R7 to pin-2 of drive IC1. User-adjustable load current is thereby achieved.

Figure 1C:
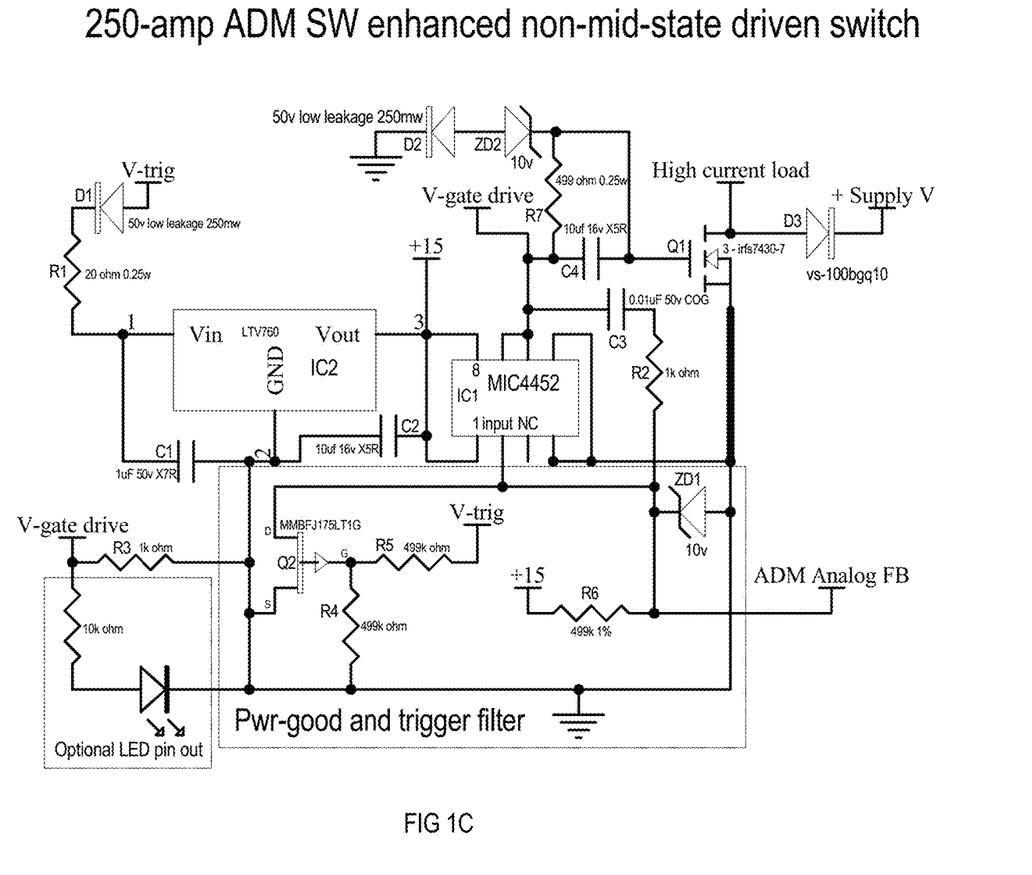
FIG. 1c is an electrical diagram illustrating a 250-amp, single-wire, negative or positive gate voltage enhanced, non-mid-state driven, solid-state contactor operational in mode 1 or mode 2.

The disclosed circuit shown in FIG. 1c operates in mode 1 or 2 and provides a noise-immune, non-mid-state, single-conductor, user-selectable drive to Q1 when V-trig is high. As is further described below, V-trig is designed to provide two functions—to provide circuit power as well as a command voltage. Drive IC1 issues a fast rise-time, high step-current, source-or-sink output state to Q1 gate upon the high, e.g., 15 to 30 vdc, or low, e.g., 0 vdc, application of the small, user-controlled, current input at V-trig. The V-trig line supplies circuit power through diode D1 and R1 to the C1-coupled input pin of voltage regulator IC2, inducing the C2-coupled output of regulator IC2. The output of regulator IC2 powers the IC1 drive and associated circuitry. V-trig also provides the command voltage to control the output state of drive IC1. When V-trig is low, the regulator IC2 input and transistor Q2 gate input is low. Ground-connected R3 holds drive IC1 output low until drive IC1 is powered. Zero voltage on the gate-pin of transistor Q2 clamps drive IC1 pin-2 low. When drive IC1 is powered, output low is internally clamped while pin-2 of drive IC1 is low.

When V-trig is high, voltage appears at the gate-pin of transistor Q2 from the divided output at R4 and R5 which turns off the drain-source path of transistor Q2, releasing the input clamp on pin-2 of drive IC1. The plus 15 vdc output of regulator IC2 connected through R6, ramps pin-2 of drive IC1 up to the output-high threshold voltage of drive IC1. The charging time of C3 through R2 and R6 determines the positive-voltage slope at pin-2 of drive IC1 and hence the Ton delay of drive IC1. When the IC1 drive output for Q1 goes high, a fast-rise, positive current is injected through R2 and C3 into the junction of Zener diode ZD1 and pin-2 of drive IC1. When V-trig is low, the Toff of drive IC1 is more immediate than the positive voltage slope since the gate-pin of transistor Q2 follows V-trig when low which clamps pin-2 of drive IC1 to ground, inducing the active-low clamping of the IC1 drive output prior to the depletion of C2. The action of each output transition at drive IC1 resets C3 to cause rapid injections of Ton or Toff current that latch a high or low input state for pin-2 of drive IC1 to prevent any mid-state instability issues in IC1 and damage to power semi-conductor Q1. Thus, the disclosed device provides stability which enables a non-mid-state environment to exist as well as noise filtering and eliminating the need for a dedicated modulation IC and associated circuitry. The operating mode is selected by changing the value of C3 and R2 for slower (mode 1) or faster (mode 2) response. For mode-2 (ADM operation), a analog voltage of 0 to 5 vdc applied to the ADM analog feed-back, allows adjustable throughput of Q1 for any load within the design limits of the SSC. 5 volt negative or positive gate bias for n or p channel power devices is achieved by the addition of D2, ZD2, C3, and R7. The orientation of D2 and ZD2 determine n or p channel power device drive function. As shown, C3 directs drive voltage and current to Q1 from drive IC1 output. The 10-volt clamping of Q1 gate by ZD2 adds 5 volts to C3 so that when IC1 output goes low, Q1 gate is pulled negative 5 volts until C3 is discharged by R7 or IC1 goes high. This action further immunizes Q1 gate from any mid-state voltage conditions and is useful in applications where negative (N-channel) or positive (P-channel) gate-source off state voltage is recommended or indicated.

Highly inductive loads may include the use of wrap around diode D3 to capture drain-source fly-back voltage and return it to the plus or minus system source line while suppressing drain-source avalanche conditions.

Figure 1D:
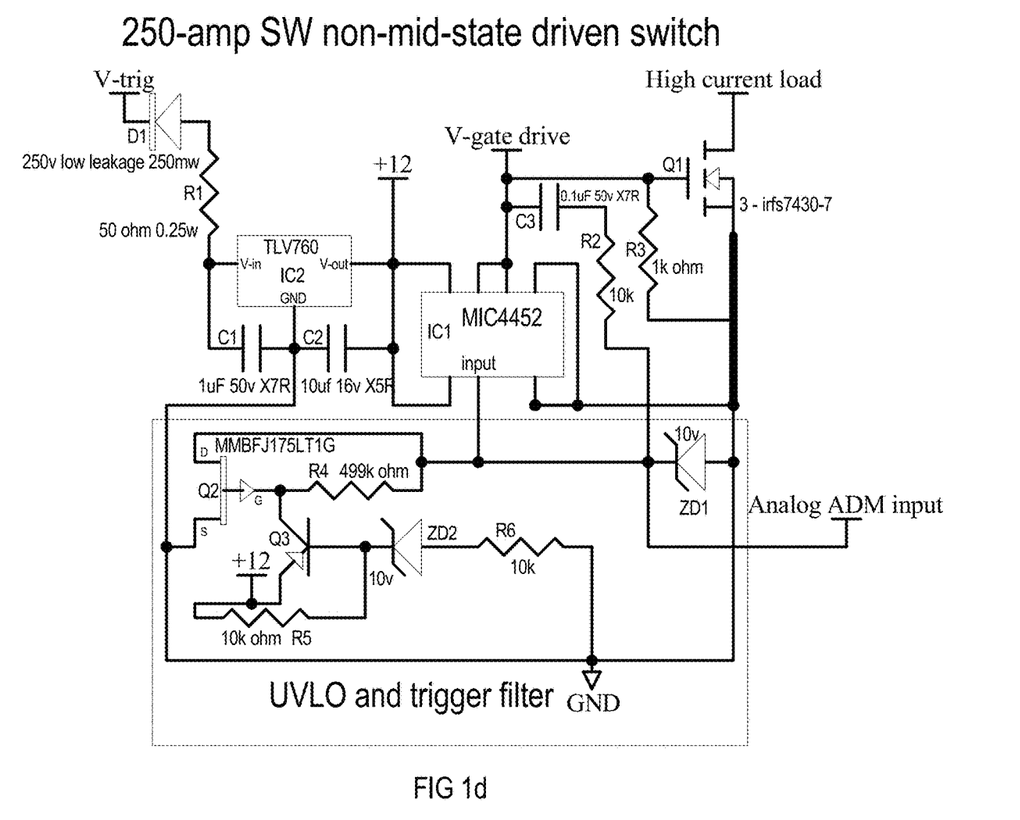
FIG. 1d is an alternate embodiment of a 250-amp, single-wire, non-mid-state driven, solid-state contactor (fixed or variable control, mode 1 or mode 2).

The disclosed circuit shown in FIG. 1d operates in mode 1 and mode 2 (fixed or variable control) and provides a noise-immune, non-mid-state, single-conductor, user-selectable drive to Q1 when V-trig is high. This embodiment is an alternative for FIG. 1 for mode 1 operation and FIGS. 1a and 1b for mode 2 (adjustable) functioning.

As is further described below, V-trig is designed to provide two functions—to provide circuit power as well as a command voltage. Drive IC1 issues a fast rise-time, high step-current, source-or-sink output state to Q1 upon the high, e.g., 15 to 30 vdc, or low, e.g., 0 vdc, application of the small, user-controlled, current input at V-trig. The V-trig line supplies circuit power through diode D1 and R1 to the C1-coupled input pin of voltage regulator IC2, inducing the C2-coupled output of regulator IC2. The output of regulator IC2 powers the IC1 drive and associated circuitry. V-trig also provides the command voltage to control the output state of drive IC1. When V-trig is low, the regulator IC2 input and transistor Q2 gate input is low. Ground connected R3 holds drive IC1 output low until drive IC1 is powered. Zero voltage on the gate-pin of transistor Q2 clamps drive IC1 pin-2 low until Q3 collector goes high upon IC2, C2 reaching 10 volts. When drive IC1 is powered, IC1 (pin 6,7) output low is internally clamped while pin-2 of drive IC1 is low.

When IC2 output is at or above 10 v, voltage appears at the gate-pin of transistor Q2 from the collector of Q3, releasing the input clamp on pin-2 of drive IC1. The plus 12 vdc output of Q3 connected through R4, ramps pin-2 of drive IC1 up to the output-high threshold voltage of drive IC1. The charging time of C3 through R2 and R6 determines the positive-voltage slope at pin-2 of drive IC1 and hence the Ton delay of drive IC1. When the IC1 drive output for Q1 goes high, a fast-rise, positive current is injected through R2 and C3 into the junction of Zener diode ZD1 and pin-2 of drive IC1. When V-trig is low, the Toff of drive IC1 is more immediate than the falling voltage slope of C2 since the gate-pin of transistor Q2 follows the collector of Q3 when IC2, C2 is below 10 volts as determined by ZD2. This clamps pin-2 of drive IC1 to ground, inducing the active-low clamping of the IC1 drive output prior to the depletion of C2. The action of each output transition at drive IC1 resets C3 to cause rapid injections of Ton or Toff current that latch a high or low input state for pin-2 of drive IC1 to prevent any mid-state instability issues in IC1 and damage to power semi-conductor Q1. The addition of Q3 being activated on or off from the output state of IC2, C2 further immunizes any mid-state potential which may result from slow rise or fall voltage at V-trig. Thus, the disclosed device provides stability which enables a non-mid-state environment to exist as well as noise filtering and eliminating the need for a dedicated modulation IC and associated circuitry.

Figure 2:
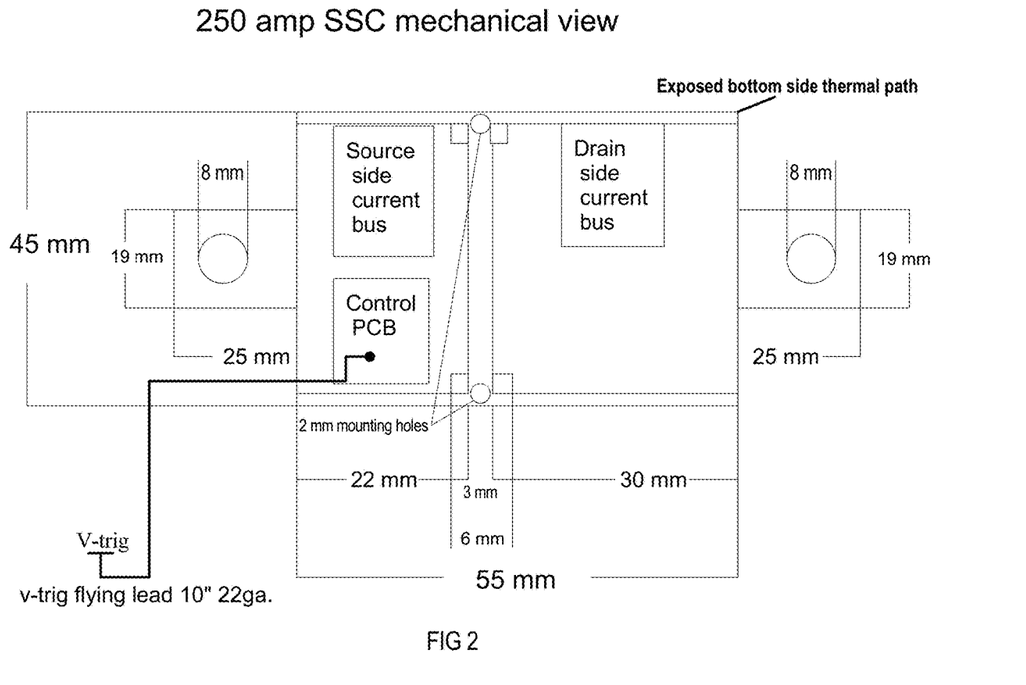
FIG. 2 is a 2-dimensional mechanical diagram illustrating one embodiment of a 250-amp, single-wire, potted or molded solid-state contactor module form factor.

FIG. 2 illustrates a 250-amp, single-wire, potted or molded solid-state contactor module form factor. The embodiment shown comprises an enclosure having rigid mounting points, electrical connection areas, and thermal-management surfaces for the application of FIGS. 1, 1a, and 1b. The module thickness, not shown in FIG. 2, can vary but is not limited to about 10 mm to about 35 mm depending on the application. The disclosed device provides for a compact solid-state solution with simplified circuitry and improved performance.

The disclosed device is a modulation-based control method applicable to any power control application. With the disclosed device, no discreet modulation generator or component is required. Further, the disclosed device provides for a single conductor input for powering, commanding, filtering, and controlling a fixed or variable high-current, power semiconductor path between a source and a load. The power semiconductor may be single or multiple normally on or off, N or P-channel power semiconductors. The control circuit disclosed herein provides a fast rise and fall time, non-mid-state drive environment to a power-semiconductor in either of two modes 1) fixed on/off, or 2) adjustable variable analog feed-back controlled conduction. The modulation-based controller offers a fluid, dynamic, multi-spectral modulation that enables user controlled, regulated conduction of said power semiconductor in said mode two operation. It is adaptive and can be used to control a variety of applications that require control or modulation. It is contemplated that the single conductor system disclosed herein could be used to control non-electronic conditions such as pressure, for example.

Although the disclosed device and method have been described with reference to disclosed embodiments, numerous modifications and variations can be made and still the result will come within the scope of the disclosure. No limitation with respect to the specific embodiments disclosed herein is intended or should be inferred.

We claim:

1. An electronic power control system comprising:
   a single conductor for supplying circuit power, said conductor also providing a command voltage, said conductor coupled to a diode, a resistive element and a voltage regulator which, in the presence of an input current from said conductor, induces an output to power a drive, a circuit of said drive capable of issuing a non-mid-state, fast rise and fall time voltage output to a power semiconductor;
   wherein user supplied input voltage allows a semi-conductor to release the input of the drive circuit, thereby allowing for filtered voltage change at the input from a low state to a threshold state, at which time fast rise-time voltage is delivered to said power semiconductor and to series-coupled capacitive and resistive elements which feed back to the input to lock the input above or below a threshold voltage; and
   wherein the output drives said semi-conductor through a capacitor pumping circuit to induce a negative voltage bias in the semi-conductor input.

2. The system of claim 1 further comprising a clamping of the drive output by the feedback supplied input voltage when a voltage threshold state is reached.

3. The system of claim 1 further comprising small filtered voltage-level changes applied to the input of said drive to induce adaptive dither modulation (ADM)—regulation behavior to maintain a user-selectable criteria.

4. The system of claim 1 further comprising small filtered voltage-level changes applied to the input of said drive to induce ADM-regulation behavior to maintain a user-selectable load current.

5. The system of claim 1, wherein said power semiconductor may be single or multiple, normally on or off, N- or P-channel.

6. The system of claim 1, wherein a signal semiconductor in said drive circuit may be single or multiple, normally on or off, N- or P-channel.

7. The system of claim 1, wherein said conductor comprises a V-trig line.

8. A controller comprising:
   a single conductor for supplying circuit power, said conductor also providing a command voltage, said conductor coupled to a diode, a resistive element and a voltage regulator which, in the presence of an input current from said conductor, induces an output to power a drive, said drive capable of issuing a non-mid-state, fast rise and fall time voltage output to a power semiconductor;
   wherein user supplied input voltage allows a semi-conductor to release the input of the drive, thereby allowing for filtered voltage change at the input from a low state to a threshold state, at which time fast rise-time voltage is delivered to said power semiconductor and to series-coupled capacitive and resistive elements which feed back to the input to lock the input above a threshold voltage;
   wherein the feedback supplied input voltage induces clamping of the drive output upon reaching a low voltage threshold state;
   wherein small filtered voltage-level changes applied to the input of said drive induce adaptive dither modulation (ADM)—regulation behavior to maintain a user-selectable criteria; and
   wherein the drive output drives said power semi-conductor through a capacitor pumping circuit to induce a negative voltage bias in the power semi-conductor input.

9. The controller of claim 8 being adaptive to control a variety of applications that require control or modulation.

10. A method for providing an electronic power control system, the method comprising the steps of:
    providing a single conductor for supplying circuit power, said conductor also enabling a command voltage, said conductor coupled to a diode, a resistive element and a voltage regulator which, in the presence of an input current from said conductor, induces an output to power a drive, said drive capable of issuing a non-mid-state, fast rise and fall time voltage output to a power semiconductor;
    introducing a user supplied input voltage that allows a semi-conductor to release the input of the drive, thereby allowing for filtered voltage change at the input from a low state to a threshold state, at which time fast rise-time voltage is delivered to said power semiconductor and to series-coupled capacitive and resistive elements which feed back to the input to lock the input above a threshold voltage; and
    using the drive output to drive said power semi-conductor through a capacitor pumping circuit to induce a negative voltage bias in the power semi-conductor input.

11. The method of claim 10 further comprising the step of using the feedback supplied input voltage to clamp the drive output when a low voltage threshold state is reached.

12. The method of claim 10 further comprising the step of applying small filtered voltage-level changes to the input of said drive to induce adaptive dither modulation (ADM) of the drive output, controlling a semi-conductor to cause load regulation behavior and maintain a user-selectable criteria.

13. A controller comprising:
    a single conductor for supplying circuit power, said conductor also providing a command voltage, said conductor coupled to a diode, a resistive element and a voltage regulator which, in the presence of an input current from said conductor, induces an output to power a drive, said drive capable of issuing a non-mid-state, fast rise and fall time voltage output to a power semiconductor;
    wherein user supplied input voltage allows a semi-conductor to release the input of the drive, thereby allowing for filtered voltage change at the input from a low state to a threshold state, at which time fast rise-time voltage is delivered to said power semiconductor and to series-coupled capacitive and resistive elements which feed back to the input to lock the input above a threshold voltage;

wherein the feedback supplied input voltage induces clamping of the drive output upon reaching a low voltage threshold state;

wherein small filtered voltage-level changes applied to the input of said drive induce adaptive dither modulation (ADM)—regulation behavior to maintain a user-selectable criteria; and wherein an internal regulator supplied output voltage is used to clamp the drive input when a low voltage threshold state is reached.

14. The controller of claim 13 wherein said internal regulator supplied output voltage clamp of the drive input enables a maintenance of non-mid-state drive conditions when a circuit defined falling internal regulator output voltage is reached.

15. The controller of claim 13 wherein said internal regulator supplied output voltage clamp of the drive input enables a maintenance of non-mid-state drive conditions when a circuit defined rising internal regulator output voltage is reached.

16. A method for providing an electronic power control system, the method comprising the steps of:

providing a single conductor for supplying circuit power, said conductor also enabling a command voltage, said conductor coupled to a diode, a resistive element and a voltage regulator which, in the presence of an input current from said conductor, induces an output to power a drive, said drive capable of issuing a non-mid-state, fast rise and fall time voltage output to a power semiconductor;

introducing a user supplied input voltage that allows a semi-conductor to release the input of the drive, thereby allowing for filtered voltage change at the input from a low state to a threshold state, at which time fast rise-time voltage is delivered to said power semiconductor and to series-coupled capacitive and resistive elements which feed back to the input to lock the input above a threshold voltage; and using an internal regulator supplied output voltage to clamp the drive input when a low voltage threshold state is reached.

17. The method of claim 16, wherein the step of using an internal regulator supplied output voltage to clamp the drive input results in a maintenance of non-mid-state drive conditions when a circuit defined falling internal regulator output voltage is reached.

18. The method of claim 16, wherein the step of using an internal regulator supplied output voltage to clamp the drive input results in a maintenance of non-mid-state drive conditions when a circuit defined rising internal regulator output voltage is reached.

* * * * *